United States Patent
Motomura

(10) Patent No.: US 10,014,492 B2
(45) Date of Patent: Jul. 3, 2018

(54) ORGANIC ELECTROLUMINESCENT DEVICE

(71) Applicant: FUJIFILM Corporation, Tokyo (JP)

(72) Inventor: Yuya Motomura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/261,882

(22) Filed: Sep. 10, 2016

(65) Prior Publication Data

US 2016/0380233 A1  Dec. 29, 2016

Related U.S. Application Data

(63) Continuation of application No. PCT/JP2015/050733, filed on Jan. 14, 2015.

(30) Foreign Application Priority Data

Mar. 19, 2014 (JP) ................................ 2014-056288

(51) Int. Cl.
*H01L 51/52* (2006.01)
*C08F 20/30* (2006.01)
(Continued)

(52) U.S. Cl.
CPC .......... *H01L 51/5253* (2013.01); *C08F 20/00* (2013.01); *C08F 20/14* (2013.01);
(Continued)

(58) Field of Classification Search
CPC ............. H01L 51/5246; H01L 51/5268; H01L 51/004; H01L 51/5253; H01L 2251/5315; H01L 2251/303; H01L 51/5271; H01L 51/52; H01L 51/00; C08F 20/00; C08F 20/14; C08F 20/30; C08F 2220/343; C08K 3/22; C08K 2003/2241
See application file for complete search history.

(56) References Cited

U.S. PATENT DOCUMENTS

2008/0176041 A1  7/2008 Sato et al.
2011/0298361 A1* 12/2011 Matsunaga .......... G02B 5/0242
                                                  313/504

FOREIGN PATENT DOCUMENTS

CN  102326101  1/2012
EP  2787375  10/2014
(Continued)

OTHER PUBLICATIONS

"Written Opinion (Form PCT/ISA/237)", dated Mar. 3, 2015, with English translation thereof, pp. 1-12.
(Continued)

*Primary Examiner* — Thanh T Nguyen
(74) *Attorney, Agent, or Firm* — JCIPRNET

(57) ABSTRACT

An organic electroluminescent device includes a substrate, an organic electroluminescent element, and a gas barrier film in this order, in which the organic electroluminescent element is sealed by bonding the substrate and the gas barrier film with an adhesive layer, the gas barrier film includes a base film and a barrier layer that includes at least one inorganic layer, the barrier layer is arranged closer to the organic electroluminescent element than to the base film, a barrier protective layer is arranged between the adhesive layer and the barrier layer, the barrier protective layer is a layer formed of a barrier protective layer forming material that includes organic particles and a binder, and the binder contains inorganic fine particles and a polyfunctional acrylic monomer.

15 Claims, 3 Drawing Sheets

(51) Int. Cl.
    *C08K 3/22*     (2006.01)
    *H01L 51/00*     (2006.01)
    *C08F 20/00*     (2006.01)
    *C08F 20/14*     (2006.01)
    *C08F 220/34*     (2006.01)

(52) U.S. Cl.
    CPC ............ *C08F 20/30* (2013.01); *C08K 3/22* (2013.01); *H01L 51/004* (2013.01); *H01L 51/5246* (2013.01); *H01L 51/5268* (2013.01); *C08F 2220/343* (2013.01); *C08K 2003/2241* (2013.01); *H01L 51/5271* (2013.01); *H01L 2251/303* (2013.01); *H01L 2251/5315* (2013.01)

(56) References Cited

FOREIGN PATENT DOCUMENTS

| | | |
|---|---|---|
| JP | 2002-313586 | 10/2002 |
| JP | 2005-251500 | 9/2005 |
| JP | 2010-114026 | 5/2010 |
| JP | 2010-198735 | 9/2010 |
| JP | 2012-020516 | 2/2012 |
| JP | 2012-109255 | 6/2012 |
| JP | 2013077460 | 4/2013 |
| JP | 2013-115008 | 6/2013 |
| WO | 2013179339 | 12/2013 |

OTHER PUBLICATIONS

"Office Action of Japan Counterpart Application" with English translation thereof, dated Mar. 21, 2017, p. 1-p. 11.

"First Office Action of China Counterpart Application" with English translation thereof, dated May 9, 2017, p. 1-p. 18.

"International Search Report (Form PCT/ISA/210) of PCT/JP2015/050733", dated Mar. 3, 2015, with English translation thereof, pp. 1-4.

"Office Action of Korea Counterpart Application" with English translation thereof, dated Jan. 29, 2018, p. 1-p. 10.

"Office Action of China Counterpart Application" with English translation thereof, dated Jan. 12, 2018, p. 1-p. 17.

"Office Action of Japan Counterpart Application," with machine English translation thereof, dated Oct. 17, 2017, p. 1-p. 10.

\* cited by examiner (11)

ORGANIC ELECTROLUMINESCENT DEVICE

CROSS-REFERENCE TO RELATED APPLICATIONS

This application is a Continuation of PCT International Application No. PCT/JP2015/050733 filed on Jan. 14, 2015, which claims priority under 35 U.S.C § 119(a) to Japanese Patent Application No. 2014-056288 filed on Mar. 19, 2014. Each of the above application(s) is hereby expressly incorporated by reference, in its entirety, into the present application.

BACKGROUND OF THE INVENTION

1. Field of the Invention

The present invention relates to an organic electroluminescent device. The present invention specifically relates to an organic electroluminescent device having an organic electroluminescent element sealed with a gas barrier film.

2. Description of the Related Art

In many organic electroluminescent devices, organic electroluminescent elements are sealed by bonding a substrate provided with an organic electroluminescent element and a sealing member with an adhesive. Using a gas barrier film which is lightweight and has impact resistance as the substrate or the sealing member has been proposed (for example, refer to JP-2012-109255A or JP-2005-251500A).

SUMMARY OF THE INVENTION

In an organic electroluminescent device using a gas barrier film, cracks are generated due to stress applied to an inorganic layer and barrier properties deteriorate, thereby causing a problem of deterioration of the durability of the organic electroluminescent device. For example, in an organic electroluminescent device with a configuration of using a gas barrier film as a sealing member, cracks are likely to be generated in the inorganic layer in the gas barrier film due to the compressive stress of an adhesive in the manufacturing process, and particularly, cracks are significantly generated in the case in which a space where the organic electroluminescent element is present between the substrate and the sealing member is filled with an adhesive and sealed. In order to prevent cracks in the inorganic layer due to the compressive stress, for example, the use of a stress relaxing layer may be considered as disclosed in JP-2012-109255A. However, when an additional layer such as a stress relaxing layer is provided, light extraction efficiency from the organic electroluminescent element deteriorates. Particularly, in the case of using a gas barrier film, there is a significant influence on the sealing member in a top emission type device.

An object of the present invention is to provide an organic electroluminescent device capable of reducing the above problem of cracks and having a configuration exhibiting good light extraction efficiency.

In order to solve the above problems, the present inventors have conducted intensive investigations and have completed the present invention.

That is, the present invention is for providing the following [1] to [11].

[1] An organic electroluminescent device includes in this order: a substrate; an organic electroluminescent element; and a gas barrier film, in which the organic electroluminescent element is sealed by bonding the substrate and the gas barrier film with an adhesive layer, and includes two electrodes and a light emitting layer that is arranged between the two electrodes, the gas barrier film includes a base film and a barrier layer that includes at least one inorganic layer, and the barrier layer is arranged closer to the organic electroluminescent element than to the base film, the organic electroluminescent device further includes a barrier protective layer that is arranged between the adhesive layer and the barrier layer, the barrier protective layer is a layer formed of a barrier protective layer forming material that includes organic particles and a binder, and the binder contains inorganic fine particles and a polyfunctional acrylic monomer.

[2] The organic electroluminescent device described in [1], further includes a reflecting layer that is arranged closer to the substrate than to the light emitting layer.

[3] The organic electroluminescent device described in [2], in which the reflecting layer is arranged between the substrate and the light emitting layer, and the reflecting layer is one of the two electrodes.

[4] The organic electroluminescent device described in [3], in which a distance between the reflecting layer and the light emitting layer is 100 nm or more.

[5] The organic electroluminescent device described in [2], in which the reflecting layer is arranged on the outer side of the substrate with respect to the organic electroluminescent element.

[6] The organic electroluminescent device described in any one of [1] to [5], in which the inorganic fine particles are titanium oxide fine particles.

[7] The organic electroluminescent device described in any one of [1] to [6], in which the adhesive layer is formed of an ultraviolet curable adhesive.

[8] The organic electroluminescent device described in any one of [1] to [7], in which a refractive index of the adhesive layer is 1.55 or more.

[9] The organic electroluminescent device described in any one of [1] to [8], in which the adhesive layer is arranged between the organic electroluminescent element and the barrier protective layer.

[10] The organic electroluminescent device described in [9], in which the adhesive layer is formed over an entire surface of the organic electroluminescent element on the opposite side to the barrier protective layer.

[11] The organic electroluminescent device described in any one of [1] to [10], in which a planarization layer is arranged between the barrier protective layer and the adhesive layer.

[12] The organic electroluminescent device described in any one of [1] to [11], in which the barrier layer is composed of a barrier laminate that includes an inorganic layer and an organic layer.

According to the present invention, there is provided an organic electroluminescent device capable of reducing problems of cracks in an inorganic layer and the like and having a configuration exhibiting good light extraction efficiency.

DESCRIPTION OF THE PREFERRED EMBODIMENTS

Figure 1A:
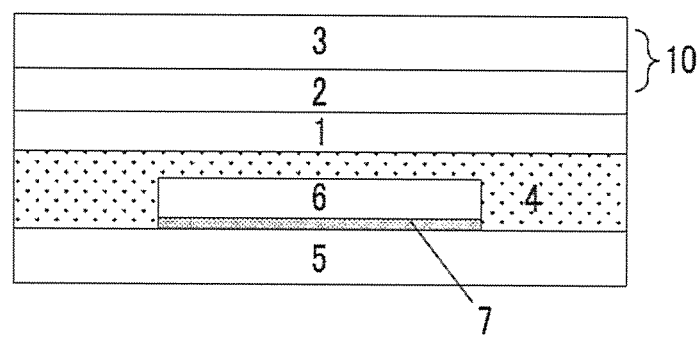
FIGS. 1A and 1B are schematic cross-sectional views of examples of an organic electroluminescent device having a barrier protective layer according to the present invention.

Hereinafter, the contents of the present invention will be described in detail.

Incidentally, the numerical range which is shown by "to" using the present specification means the range including the numerical values described before and after the "to" as the minimum value and the maximum value, respectively. In the present specification, a description of "(meth)acrylate" represents the meaning of "either or both of acrylate and methacrylate". "(Meth)acryloyl" and the like are the same.

<Organic Electroluminescent Device>

The present invention relates to an organic electroluminescent device including a substrate, an organic electroluminescent element, and a gas barrier film. By sealing (closing) the organic electroluminescent element together with the substrate using a gas barrier film having a function of blocking atmospheric oxygen, moisture, nitrogen oxides, sulfur oxides, ozone, and the like, the organic electroluminescent element which is likely to be deteriorated with time by water, oxygen, and the like when used under normal temperature and normal pressure can be protected from deterioration. The organic electroluminescent device of the present invention has a configuration in which the organic electroluminescent element is sealed by bonding the gas barrier film and the substrate with an adhesive layer.

The organic electroluminescent device has a structure including a part in which a substrate, an organic electroluminescent element, an adhesive layer, and a gas barrier film are arranged in the thickness direction of the substrate in this order.

The organic electroluminescent device can be generally produced by, for example, (1) forming an organic electroluminescent element at the center of one surface of a substrate (the above one surface of the substrate on which the organic electroluminescent element is formed in the present specification is sometimes referred to as a "surface"); (2) applying an adhesive to at least the periphery of the organic electroluminescent element on the surface of the substrate obtained from (1); and (3) bonding a gas barrier film and the substrate with the adhesive. That is, for example, an organic electroluminescent element can be formed at the center of the surface of the substrate, an adhesive can be then applied to the outer side of the organic electroluminescent element on the surface so as to completely surround the organic electroluminescent element, and finally a gas barrier film can be bonded to the substrate with an adhesive from the surface to the substrate.

In the organic electroluminescent device of the present invention, the adhesive layer formed of an adhesive is present over the entire surface between the organic electroluminescent element and the gas barrier film and preferably extends over the periphery thereof. When the organic electroluminescent device having the configuration is produced, for example, the adhesive may be applied so as to cover the surface of the organic electroluminescent element and the periphery of the organic electroluminescent element and the substrate and the gas barrier film may be bonded to each other.

<Barrier Protective Layer>

The organic electroluminescent device of the present invention includes a barrier protective layer arranged between the gas barrier film and the adhesive layer. From the study of the present inventors, it has been found that by providing a barrier protective layer, damage to an inorganic layer in the gas barrier film is reduced and adhesiveness is improved. In addition, when a barrier protective layer formed of a material that includes organic particles and a binder, which will be described below in detail, is used, light from the organic electroluminescent element provided on one surface of the layer can be efficiently extracted and diffused to a direction of the other surface thereof. Therefore, it has been found that, for example, even in the case of using the organic electroluminescent device as a top emission type organic electroluminescent device, good light extraction efficiency is obtained.

Not adhering to any theory, it is considered that when the barrier protective layer includes organic particles, the ratio of a non-polymeric portion of the binder is reduced and the barrier protective layer becomes stronger compared to a case not including organic particles, thereby preventing the breakage of the barrier layer due to scratching, bending, and the like. Further, it is considered that due to a reduction in the ratio of the non-polymeric portion, the destruction of barrier properties caused by a solvent entering from the non-polymeric portion is reduced.

Incidentally, the light extraction efficiency can be obtained by measuring external quantum efficiency. The light extraction efficiency can be obtained by measuring the external quantum efficiency of an organic EL element sealed with a sealing member having a barrier protective layer and the external quantum efficiency of an organic EL element sealed with a sealing member not having a barrier protective layer and comparing the external quantum efficiencies of the respective elements.

(Barrier Protective Layer Forming Material)

The barrier protective layer is formed of a barrier protective layer forming material including organic particles and a binder. Any barrier protective layer forming material may be used as long as the barrier protective layer forming material can be obtained in the form of a dispersion liquid in which organic particles are dispersed in the following binder is obtained. The barrier protective layer forming material can be formed by mixing a binder and organic particles by stirring or the like, adding each component of the following binder and organic particles in a solvent and mixing the components, and the like.

(Binder)

The binder is a composition including inorganic fine particles and a polyfunctional acrylic monomer. The binder may contain other components, as required.

(Inorganic Fine Particles)

The refractive index of the barrier protective layer can be increased by adding inorganic fine particles. Specifically, the refractive index of the barrier protective layer may be adjusted to be higher than the refractive index of a glass substrate (n(refractive index)=about 1.5)) or a polymer layer (n=about 1.6) formed by polymerization of (meth)acrylate. In the present specification, the term "fine particles" means particles having an average primary particle diameter of 1 nm to 500 nm.

Examples of the inorganic fine particles include fine particles of $ZrO_2$, $TiO_2$, $Al_2O_3$, $In_2O_3$, $ZnO$, $SnO_2$, $Sb_2O_3$, and the like. Among these, fine particles of $TiO_2$, $ZrO_2$, ZnO, and $SnO_2$ are more preferable. Particularly preferable $TiO_2$ fine particles (titanium oxide fine particles) will be described below.

The titanium oxide fine particles are not particularly limited. However, photocatalytic inactivation-treated titanium oxide fine particles are preferably used. Examples of the photocatalytic inactivation-treated titanium oxide fine particles include (1) titanium oxide fine particles obtained by coating the surface of titanium oxide fine particles with at least one of alumina, silica, and zirconia, and (2) titanium oxide fine particles obtained by coating the uncoated surface of the coated titanium oxide fine particles of (1) with resin. Examples of the resin include polymethyl methacrylate (PMMA).

It is possible to confirm that the photocatalytic inactivation-treated titanium oxide fine particles do not have a photocatalytic activity by, for example, a methylene blue method and the like.

The titanium oxide fine particles of the photocatalytic inactivation-treated titanium oxide fine particles are not particularly limited and can be appropriately selected according to the purpose. The crystal structure thereof preferably has a rutile, rutile/anatase mixed crystal, or anatase as a main component and particularly preferably has a rutile structure as a main component.

The titanium oxide fine particles may be composite particles obtained by adding metal oxides other than titanium oxide.

Examples of the metal oxides which may complex the titanium oxide fine particles preferably include oxides of at least one metal selected from Sn, Zr, Si, Zn, and Al. The amount of metal oxide to be added to titanium is preferably 1% by mole to 40% by mole, more preferably 2% by mole to 35% by mole, and even more preferably 3% by mole to 30% by mole.

The average primary particle diameter of the inorganic fine particles is preferably 1 nm to 100 nm. In the case of using titanium oxide fine particles, the average primary particle diameter of the titanium oxide fine particles is preferably 1 nm to 30 nm, more preferably 1 nm to 25 nm, and even more preferably 1 nm to 20 nm. In the case in which the average primary particle diameter exceeds 30 nm, the dispersion liquid is cloudy and precipitation occurs in some cases. In the case in which the average primary particle diameter is less than 1 nm, the crystal structure is not clear and is in a state close to an amorphous structure, and changes such as gelation occur with time.

The average primary particle diameter can be measured by, for example, calculation from a half-value width of a diffraction pattern measured with an X-ray diffraction (XRD) apparatus or statistical calculation from diameters of particles of a micrograph taken by an electron microscope (TEM). However, in the present specification, a value measured based on statistical calculation from diameters of particles of a micrograph taken by an electron microscope (TEM) is used as a reference value.

The shape of the inorganic fine particles is not particularly limited and can be appropriately selected according to the purpose. For example, the shape of the inorganic fine particles is preferably a rice-grain shape, a spherical shape, a cubic shape, a spindle shape, or an amorphous shape. One type of inorganic fine particles may be used alone or two or more types of inorganic fine particles may be used in combination.

It is desirable that an aggregate of inorganic fine particles is not included as much as possible and but in the case of including an aggregate of inorganic fine particles, the average secondary particle diameter of the inorganic fine particles is preferably 20 nm to 200 nm. In the case of using titanium oxide fine particles, the average secondary particle diameter of the titanium oxide fine particles is preferably 100 nm or less, more preferably 80 nm or less, and even more preferably 70 nm or less.

The secondary particle diameter is defined as the size of an aggregate when primary particles aggregate in a certain state (in environment) with respect to the primary particle diameter that is defined as the diameter of fine particles in a state in which fine particles are ideally dispersed. In a dispersion including general fine particles, fine particles having a certain degree of size aggregate in many cases. In addition, as the method of measuring the average secondary particle diameter, a dynamic light scattering method, a laser diffraction method, an image imaging method, and the like may be used. The value of the average secondary particle diameter defined in the present specification is obtained based on a dynamic light scattering method.

The method of controlling the average secondary particle diameter includes addition of a dispersing agent. The dispersion state is controlled depending on the type and the amount of addition of the dispersing agent and then the average secondary particle diameter is adjusted.

Examples of the dispersing agent include amine-based, polycarboxylic acid alkyl ester-based, and polyether-based dispersing agents. The dispersing agent is not particularly limited to the examples. Commercially available products in which particles are dispersed to have a desired average secondary particle diameter may be used.

The refractive index of the inorganic fine particles is preferably 2.2 or more and 3.0 or less, more preferably 2.2 or more and 2.8 or less, and even more preferably 2.2 or more and 2.7 or less. When the refractive index is 2.2 or more, the refractive index of the barrier protective layer can be effectively increased and when the refractive index is 3.0 or less, a defect such as coloration of inorganic fine particles or the like does not occur and thus the refractive index within the above range is preferable.

Here, it is difficult to measure the refractive index of fine particles having a high refractive index (1.8 or more) and an average primary particle diameter of about 1 nm to 100 nm, like titanium oxide fine particles. However, the refractive index can be measured as follows. A resin material, the refractive index of which is known, is doped with inorganic fine particles, and the resin material in which the inorganic fine particles are dispersed is applied to a Si substrate or a quartz substrate to form a coating film. The refractive index of the coating film is measured with an ellipsometer, and the refractive index of the inorganic fine particles can be calculated from the volume fractions of the resin material and the inorganic fine particles constituting the coating film.

The content of the inorganic fine particles calculated from the following expression is preferably 10% by volume or more and 50% by volume or less, more preferably 20% by volume or more and 40% by volume or less, and even more preferably 25% by volume or more and 35% by volume or less with respect to the volume of the binder (excluding a solvent).

Content of inorganic fine particles (% by volume)= (Mass/specific gravity of inorganic fine particles)/[(Mass/specific gravity of inorganic fine particles)+(Mass of polyfunctional acrylic monomer/Specific gravity of polyfunctional acrylic monomer)]                    Expression:

The specific gravity of titanium oxide fine particles is 4.

(Polyfunctional Acrylic Monomer)

In the present specification, the term "polyfunctional acrylic monomer" means a monomer having two or more (meth)acryloyl groups. Specifically, for example, as the polyfunctional acrylic monomer, compounds described in paragraphs "0024" to "0036" of JP2013-43382A or paragraphs "0036" to "0048" of JP2013-43384A can be used. The polyfunctional acrylic monomer preferably has a fluorene skeleton.

Examples of the polyfunctional acrylic monomer having a fluorene skeleton include the compound represented by Formula (2) described in WO2013/047524.

The ratio of the polyfunctional acrylic monomer in the solid content of the binder (a residue after a volatile content is volatilized) is preferably 5% by mass to 50% by mass and more preferably 10% by mass to 30% by mass.

The binder may include, as an additive, in addition to the polyfunctional acrylic monomer, a thermoplastic resin, a combination of a reactive curable resin and a curing agent, and other polyfunctional monomers and other polyfunctional olygomers, described in paragraphs "0020" to "0045" of JP2012-155177A.

(Polymerization Initiator)

The binder may contain a polymerization initiator.

Examples of the polymerization initiator include photopolymerization initiators described in paragraphs "0046" to "0058" of JP2012-155177A. Specific examples thereof include IRGACURE series, available from Ciba Specialty Chemicals, (for example, IRGACURE 651, IRGACURE 754, IRGACURE 184, IRGACURE 2959, IRGACURE 907, IRGACURE 369, IRGACURE 379, IRGACURE 819 and the like), DAROCUR series, (for example, DAROCUR TPO, DAROCUR 1173, and the like), QUANTACURE PDO, and EZACURE series, available from Lamberti S.p.A., (for example, EZACURE TZM, EZACURE TZT, EZACURE KTO46, and the like). In the case of using the polymerization initiator, the content thereof is preferably 0.1% by mole or more and more preferably 0.5% by mole to 5% by mole of the total amount of compounds which participate in polymerization. By employing such a composition, the polymerization reaction taking place through reactions producing active components can be appropriately controlled.

(Fluorine-Based Surfactant)

The binder may contain a fluorine-based surfactant.

Examples of the fluorine-based surfactant include fluorine-based surfactants described in each publication of JP2002-255921A, JP2003-114504A, JP2003-140288A, JP2003-149759A, JP2003-195454A, and JP2004-240187A. The surfactant is not particularly limited and any of anionic, cationic, nonionic, and amphoteric (betaine) surfactants maybe used.

Examples of specific compounds include FS-1 to FS-29 anionic fluorine-based surfactants described in JP2002-255921A, FS-1 to FS-71 cationic and amphoteric fluorine-based surfactants described in JP2003-114504A, FS-1 to FS-38 anionic fluorine-based surfactants described in JP2003-140288A, FS-1 to FS-39 cationic fluorine-based surfactants described in JP2003-149759A, and FS-1 to FS-32 anionic, cationic, and nonionic fluorine-based surfactants described in JP2003-195454A.

The fluorine-based surfactant may be included in the binder in an amount of 0.01% by mass or more with respect to the total solid content mass of the barrier protective layer forming material (the mass after a solvent is removed).

(Solvent)

The binder may be formed by dissolving the respective components in a solvent. A barrier protective layer forming material may be prepared in the form of a dispersion liquid in which organic particles are dispersed in the binder by mixing the respective components and the organic particles in a solvent. The solvent is not particularly limited and can be appropriately selected according to the purpose.

Examples of the solvent include alcohols, ketones, esters, amides, ethers, ether esters, aliphatic hydrocarbons, and halogenated hydrocarbons. Specific examples include alcohols (for example, methanol, ethanol, propanol, butanol, benzyl alcohol, ethylene glycol, propylene glycol, and ethylene glycol monoacetate), ketones (for example, methyl ethyl ketone, methyl isobutyl ketone, cyclohexanone, and methylcyclohexanone), esters (for example, methyl acetate, ethyl acetate, propyl acetate, butyl acetate, ethyl formate, propyl formate, butyl formate, and ethyl lactate), aliphatic hydrocarbons (for example, hexane and cyclohexane), halogenated hydrocarbons (for example, methylchloroform), aromatic hydrocarbons (for example, benzene, toluene, xylene, and ethylbenzene), amides (for example, dimethylformamide, dimethylacetatamide, and n-methylpyrrolidone), ethers (for example, dioxane, tetrahydrofuran, ethylene glycol dimethyl ether, and propylene glycol dimethyl ether), and ether alcohols (for example, 1-methoxy-2-propanol, ethyl cellosolve, and methyl carbinol). These solvents may be used alone or in combination of two or more thereof. Among these, aromatic hydrocarbons and ketones are preferable, toluene, xylene, methyl ethyl ketone, methyl isobutyl ketone, and cyclohexanone are more preferably, and toluene and xylene are particularly preferable.

(Organic Particles)

In the barrier protective layer, organic particles function as light diffusing particles that diffuse light. The organic particles are not particularly limited as long as the organic particles are capable of diffusing light, and can be appropriately selected according to the purpose. Two or more types of particles may be used.

Examples of the organic particles include polymethyl methacrylate particles, cross-linked polymethyl methacrylate particles, acryl-styrene copolymer particles, melamine particles, polycarbonate particles, polystyrene particles, cross-linked polystyrene particles, polyvinyl chloride particles, and benzoguanamine-melamine formaldehyde particles.

Among these, as the organic particles, from the viewpoint of solvent resistance and dispersibility in the binder, resin particles in a cross-linked state are preferable and cross-linked polymethyl methacrylate particles are particularly preferable.

It is possible to confirm that the organic particles are resin particles in a cross-linked state by observing how difficult for the resin particles to be dissolved by dispersing the resin particles in a solvent, for example, toluene.

It is required that the refractive index of the organic particles should be different from the refractive index of the binder. When the refractive index of the light diffusing particles becomes close to the refractive index of the binder, light scattering does not occur and light extraction efficiency is deteriorated in some cases.

The refractive index of the organic particles can be measured with a precision spectrometer (GMR-1DA, manufactured by Shimadzu Corporation) by the Shrivsky method after measuring the refractive index of a reflective liquid using, for example, an automatic refractometer (KPR-2000, manufactured by Shimadzu Corporation).

The difference in refractive index |A−B| (absolute value) between the refractive index A of the binder and the refractive index B of the organic particles may be 0.2 or more and 1.0 or less, is preferably 0.2 or more and 0.7 or less, and more preferably 0.2 or more and 0.6 or less.

The average particle diameter of the organic particles is preferably 0.5 μm to 10 μm, more preferably 0.5 μm to 6 μm, and still more preferably 1 μm to 3 μm. When the average particle diameter of the organic particles exceeds 10 µm, most of light scatters forward and the capability of changing the light angle by the organic particles may be deteriorated in some cases. On the other hand, when the average particle diameter of the organic particles is less than 0.5 µm, the average particle diameter of the organic particles becomes smaller than the wavelength of visible light, and Mie scattering is changed to a region of Rayleigh scattering. Due to this, the dependence of the scattering efficiency of the organic particles on the wavelength increases and the chromaticity of the organic electroluminescent element is significantly changed or backward scattering become stronger. Therefore, deterioration in light extraction efficiency is predicted.

The average particle diameter of the organic particles can be measured by, for example, a device using a dynamic light scattering method, such as NANOTRAC UPA-EX150 manufactured by Nikkiso Co., Ltd., or image processing of the electron micrographs.

The content of the organic particles in the solid content of the binder (a residue after a volatile content is volatilized) is preferably 20% by volume to 70% by volume and more preferably 40% by volume to 60% by volume.

(Method of Forming Barrier Protective Layer)

The barrier protective layer can be formed by curing the barrier protective layer forming material. The barrier protective layer forming material is applied to the surface of the gas barrier film and then cured. The surface of the gas barrier film to which the barrier protective layer forming material is applied is preferably an inorganic layer. Further, as required, the barrier protective layer may be formed by applying the barrier protective layer material and then drying the material or heating the material before curing, during curing, or after curing.

The application may be carried out by a known method of forming a thin film, such as a dip coating method, an air knife coating method, a curtain coating method, a roller coating method, a wire bar coating method, a gravure coating method, a micro gravure coating method, and an extrusion coating method. Among these methods, application by non-contact transport and an extrusion coating method using a die coater or a slit coater not to be in contact with an under inorganic layer is preferable. In the extrusion coating method, when the barrier protective layer forming material is applied to the inorganic layer, only the liquid pool is in contact with the inorganic layer and the coating device is not in direct contact with the layer. This is because damage such as cracks or fissures due to a physical contact is less likely to occur in the inorganic layer.

The barrier protective layer forming material or a planarization layer forming material (coating solution) may be cured by light (for example, ultraviolet rays), an electron beam, or heat rays and is preferably cured by light. Particularly, it is preferable to cure the coating solution while heating the coating solution at a temperature of 25° C. or higher (for example, 30° C. to 130° C.). The coating solution is effectively cured by promoting the free motion of the polyfunctional acrylic monomer by heating and film formation can be conducted without causing damage to the gas barrier film.

The light used for curing the coating solution may be light having a wavelength in the vicinity of a wavelength (absorption wavelength) region at which a photopolymerization initiator is reacted, and in the case in which the absorption wavelength is in the ultraviolet region, examples of the light source to be used include ultrahigh pressure, high pressure, intermediate pressure and a low pressure mercury lamp, a chemical lamp, a carbon arc lamp, a metal halide lamp, a xenon lamp, and sunlight. Various available laser light sources with a wavelength of 350 nm to 420 nm may be multi-beamed and emitted. In addition, in the case in which the absorption wavelength is in the infrared region, examples of the light source include a halogen lamp, a xenon lamp and a high pressure sodium lamp. Various available laser light sources with a wavelength of 750 nm to 1,400 nm may be multi-beamed and emitted.

The photoradical polymerization by photoirradiation can be carried out in the air or an inert gas. In the case of photoradical polymerization by photoirradiation, it is preferable to create an atmosphere in which the oxygen concentration is maintained as low as possible in order to shorten the induction period for polymerization of the radical polymerizable monomer, sufficiently increase the polymerization ratio, or the like. The oxygen concentration range is preferably 0 ppm to 1,000 ppm, more preferably 0 ppm to 800 ppm, and even more preferably 0 ppm to 600 ppm. The irradiation intensity of the ultraviolet light to be emitted is preferably 0.1 mW/cm$^2$ to 100 mW/cm$^2$, and the light irradiation dose on the surface of the coating film is preferably 100 mJ/cm$^2$ to 10,000 mJ/cm$^2$, more preferably 100 mJ/cm$^2$ to 5,000 mJ/cm$^2$, and particularly preferably 100 mJ/cm$^2$ to 1,000 mJ/cm$^2$.

When the light irradiation dose is less than 100 mJ/cm$^2$, the barrier protective layer is not sufficiently cured and thus is dissolved when the planarization layer is applied to the barrier protective layer or collapses when the substrate is washed in some cases. On the other hand, when the light irradiation dose exceeds 10,000 mJ/cm$^2$, the polymerization of the barrier protective layer excessively proceeds and the surface thereof turns yellow. Then, the transmittance is deteriorated and light extraction efficiency is deteriorated in some cases.

In the case of producing a gas barrier film by a roll to roll process, it is preferable that a film under manufacture is wound around a backup roll so to obtain a gas barrier film from the backup roll such that heating can be carried out from the gas barrier film. In addition, it is preferable that the light irradiation is carried out while carrying out heating from the gas barrier film at a temperature of 30° C. or higher and lower than 100° C.

(Physical Properties of Barrier Protective Layer and the Like)

The content of the organic particles in the barrier protective layer is preferably 30% by volume or more and 66% by volume or less, more preferably 40% by volume or more and 60% by volume or less, and particularly preferably 45% by volume or more and 55% by volume or less.

The average thickness of the barrier protective layer is preferably 0.5 µm to 15 µm, more preferably 1 µm to 7 µm, and particularly preferably 1.5 µm to 5 µm. The average thickness of the barrier protective layer can be obtained by, for example, collecting a part of the barrier protective layer and measuring the thickness with a scanning electron microscope (S-3400N, manufactured by Hitachi High Technologies Co.).

The refractive index of the binder in the barrier protective layer is preferably 1.7 to 2.2, more preferably 1.7 to 2.1, and even more preferably 1.7 to 2.0. In addition, it is preferable that the refractive index of the binder in the barrier protective layer is equal to the refractive indices of a light emitting layer and an electrode in an organic electroluminescent layer or higher than the refractive indices thereof.

The barrier protective layer preferably has organic particles that are uniformly dispersed on the surface thereof and the difference in height on the surface of the barrier protective layer is preferably 0.3 µm to 2 µm.

(Planarization Layer)

The planarization layer may be provided on the surface of the barrier protective layer close to the organic electroluminescent element. The planarization layer is a layer provided for planarizing the uneven shape of the surface of the barrier protective layer. The uneven shape of the surface of the barrier protective layer is likely to be formed due to the organic particles being dispersed in the barrier protective layer. The surface roughness (Ra) of the surface of the planarization layer that is formed on the surface of the barrier protective layer is preferably 3 nm or less in a 10 µm square (a square whose one side is 10 µm). In the present specification, the value of the surface roughness is obtained by measuring a size of 10 µm square with an intermolecular force microscope.

The planarization layer is preferably a layer that is formed from a material having a composition in which organic particles are not included in the barrier protective layer forming material (the composition of the binder) and can be formed on the same manner as the barrier protective layer. Any planarization layer forming material may be used as long as the material has the composition of the above-described binder in the barrier protective layer forming material. The polyfunctional acrylic monomers, polymerization initiators, surfactants, and other additives for the barrier protective layer forming material and the planarization layer forming material may be the same or different from each other.

The average thickness of the planarization layer is not particularly limited and can be appropriately selected according to the purpose. The average thickness is preferably 0.5 µm to 5 µm, more preferably 1 µm to 3 µm, and particularly preferably 1.5 µm to 2.5 µm.

The total average thickness of the barrier protective layer and the planarization layer may be 1 µm to 20 µm, is preferably 2 µm to 15 µm, more preferably 3 µm to 14 µm, and particularly preferably 5 µm to 12 µm.

The refractive index of the planarization layer is preferably 1.7 to 2.2, more preferably 1.7 to 2.1, and even more preferably 1.7 to 2.0.

The refractive index of the planarization layer is preferably equal to the refractive index of the binder of the barrier protective layer or higher than the refractive index of the binder of the barrier protective layer. The difference (Δn) between the refractive index of the binder of the barrier protective layer and the refractive index of the planarization layer is 0.05 or less and more preferably 0.02 or less.

<Substrate>

The substrate for providing the organic electroluminescent element is not particularly limited with respect to the shape, structure, size, material and the like and can be appropriately selected according to the purpose. Examples of the shape include a flat plate shape and the like. The structure may be a single layer structure or a laminated structure, and the size can be appropriately selected according to the size of an organic electroluminescent device to be produced and the like.

The material for the substrate is not particularly limited and can be appropriately selected according to the purpose. Examples thereof include inorganic materials such as yttria-stabilized zirconia (YSZ) and glass (alkali-free glass, soda lime glass and the like), polyester resins such as polyethylene terephthalate (PET) and polyethylene naphthalate (PEN), polycarbonate, polyimide resin (PI), polyethylene, polyvinyl chloride, polyvinylidene chloride, polystyrene, styrene-acrylonitrile copolymers and the like. These materials may be used alone or in combination of two or more thereof. Among these, polyester resin is preferable and polyethylene terephthalate (PET) and polyethylene naphthalate (PEN) are particularly preferable from the viewpoint of application suitability in a roll.

As the substrate, a gas barrier film, which will be described later, may be used. In the case in which a gas barrier film is used as the substrate, it is preferable to form the organic electroluminescent element on the surface of the base film close to the barrier layer. It is preferable that the outermost surface on which an organic electroluminescent element is formed is an inorganic layer.

As the substrate, a substrate which is appropriately synthesized may be used, and a commercially available product may be used.

The thickness of the substrate is not particularly limited and can be appropriately selected according to the purpose. The thickness is preferably 10 µm or more and more preferably 50 µm or more.

<Gas Barrier Film>

The gas barrier film has a base film and a barrier layer that is formed on the base film. In the gas barrier film, the barrier layer may be provided on only one surface or both surfaces of the base film. However, it is preferable that the barrier layer is provided on only one surface of the base film.

The barrier layer includes at least one inorganic layer. The barrier layer may be a barrier laminate that includes at least one inorganic layer and at least one organic layer.

The gas barrier film may have the barrier layer and constituent components other than the base film (for example, a functional layer such as an easily adhesive layer or an easily lubricating layer). The functional layer may be arranged on any one of a barrier laminate, between the barrier layer and the substrate, or on a surface of the substrate on which the barrier layer is not arranged (rear surface).

The film thickness of the gas barrier film is preferably 20 µm to 200 µm and more preferably 50 µm to 150 µm.

(Base Film)

In the gas barrier film, a plastic film is typically used as a base film. The plastic film to be used is not particularly limited with respect to material, thickness and the like as long as the film can hold a barrier laminate, and can be appropriately selected according to the purpose of use or the like. Specific examples of the plastic film include thermoplastic resins such as polyester resins, methacrylic resins, methacrylic acid-maleic acid copolymers, polystyrene resins, transparent fluorocarbon resins, polyimides, fluorinated polyimide resins, polyamide resins, polyamide-imide resins, polyetherimide resins, cellulose acylate resins, polyurethane resins, polyetheretherketone resins, polycarbonate resins, alicyclic polyolefin resins, polyarylate resins, polyethersulfone resins, polysulfone resins, cycloolefin copolymers, fluorene ring-modified polycarbonate resins, alicyclic modified polycarbonate resins, fluorene ring-modified polyester resins and acryloylated compounds.

The film thickness of the base film is preferably 10 µm to 250 µm and more preferably 20 µm to 130 µm.

(Barrier Layer)

The barrier layer may be composed of one inorganic layer and may be a barrier laminate that includes at least one inorganic layer and at least one organic layer.

In the organic electroluminescent device, the barrier layer is arranged on the surface of the base film close to the organic electroluminescent element and the barrier protective layer is arranged between the adhesive layer and the barrier layer. It is preferable that the barrier layer is in a direct contact with the barrier protective layer. In addition, it is preferable that the inorganic layer in the barrier layer is in a direct contact with barrier protective layer.

The total film thickness of the barrier layer, the barrier protective layer, and the planarization layer is preferably 1.5 µm to 30 µm and more preferably 2 µm to 25 µm.

(Barrier Laminate)

The barrier laminate may be a laminate formed by laminating two or more organic layers and two or more inorganic layers in an alternate manner. The barrier laminate may be configured such that at least one inorganic layer does not have an organic layer on the outer side thereof.

The number of layers constituting the barrier laminate is not particularly limited and typically, 2 layers to 30 layers are preferable and 3 layers to 20 layers are more preferable. In addition, the barrier laminate may include the organic layer and a constituent layer other than the inorganic layer. The film thickness of the barrier laminate is preferably 0.5 µm to 10 µm and more preferably 1 µm to 5 µm.

The barrier laminate may include a so-called graded material layer in which an organic region and an inorganic region continuously change in the film thickness direction for the composition constituting the barrier laminate within a range not departing from the spirit of the present invention. Particularly, the barrier laminate may include a graded material layer between a specific organic layer and an inorganic layer that is directly formed on the surface of the organic layer. Examples of the graded material layer include materials described in a report by Kim et al., in "Journal of Vacuum Science and Technology A, Vol. 23, p. 971-977 (2005 American Vacuum Society)"; and a continuous laminate of an organic layer and an inorganic layer with no interface therebetween as disclosed in US2004/46497A. For simplifying the description hereinunder, the organic layer and the organic region are expressed as "organic layer" and the inorganic layer and the inorganic region are as "inorganic layer".

(Inorganic Layer)

The inorganic layer constituting the barrier layer and the inorganic layer in the barrier laminate are typically layers of thin films formed of a metal compound. For forming the inorganic layer, employable is any method capable of forming the intended thin film. For example, physical vapor-phase deposition method (PVD) such as a vapor evaporation method, a sputtering method or an ion-plating method; various chemical vapor-phase deposition method (CVD); and liquid-phase deposition method such as a plating method or a sol-gel method may be used.

The component to be included in the inorganic layer is not particularly limited as long as the component satisfies the above performance, and examples thereof include metal oxides, metal nitrides, metal carbides, metal oxinitrides, and metal oxycarbides. Oxides, nitrides, carbides, oxinitrides, and oxycarbides including one or more metals selected from Si, Al, In, Sn, Zn, Ti, Cu, Ce and Ta can be preferably used. Among these, oxides, nitrides or oxinitrides of a metal selected from Si, Al, In, Sn, Zn, and Ti are preferable and metal oxides, nitrides or oxinitrides with Si or Al are particularly preferable. These may contain any other element as a subsidiary component. For example, a nitride having a hydroxyl group may be employed.

As the inorganic layer, inorganic layers including Si are particularly preferable. This is because the inorganic layers have higher transparency and more excellent gas barrier properties. Among these, an inorganic layer composed of silicon nitride is particularly preferable.

For example, the inorganic layer may include an appropriate amount of hydrogen by hydrogen included in metal oxides, nitrides or oxinitrides. The hydrogen concentration in forward Rutherford scattering is preferably 30% or lower.

Regarding the smoothness of the inorganic layer formed in the present invention, the average roughness of 1 µm square (Ra value) is preferably less than 3 nm and more preferably 1 nm or less.

The thickness of the inorganic layer is not particularly limited and the thickness for one layer is typically within a range of 5 nm to 500 nm, preferably 10 nm to 200 nm, and more preferably 15 nm to 50 nm. The inorganic layer may have a laminated structure composed of a plurality of sublayers. In this case, each sublayer may have the same composition or different compositions.

(Organic Layer)

The organic layer can be preferably formed by curing a polymerizable composition including a polymerizable compound.

(Polymerizable Compound)

The polymerizable compound is preferably a compound having an ethylenically unsaturated bond at the terminal or in the side chain and/or a compound having epoxy or oxetane at the terminal or in the side chain. As the polymerizable compound, a compound having an ethylenically unsaturated bond at the terminal end or in the side chain is particularly preferable. Examples of the a compound having an ethylenically unsaturated bond at the terminal or in the side chain include (meth)acrylate compounds, acrylamide compounds, styrene compound, and maleic anhydride. Preferable are (meth)acrylate compounds and particularly preferable are acrylate compounds.

As (meth)acrylate compounds, preferred are (meth)acrylates, urethane-(meth)acrylates, polyester-(meth)acrylates, epoxy(meth)acrylates, and the like.

As styrene compounds, preferred are styrene, α-methylstyrene, 4-methylstyrene, divinylbenzene, 4-hydroxystyrene, 4-carboxystyrene, and the like.

Specifically, as (meth)acrylate compounds, compounds described in paragraphs "0024" to "0036" of JP2013-43382A or paragraphs "0036" to "0048" of JP2013-43384A can be used.

In addition, polyfunctional acrylic monomers having a fluorene skeleton, such as the compound represented by Formula (2) described in WO2013/047524, can be used.

(Polymerization Initiator)

The polymerizable composition for forming the organic layer may include a polymerization initiator. In the case of using a polymerization initiator, the content thereof is preferably 0.1% by mole or more and more preferably 0.5% by mole to 5% by mole of the total amount of compounds which participate in polymerization. By employing such a composition, the polymerization reaction taking place through reactions producing active components can be appropriately controlled. Examples of the polymerization initiator include the same polymerization initiators as the above polymerization initiators which may contain the binder of the barrier protective layer.

(Silane Coupling Agent)

The polymerizable composition for forming the organic layer may include a silane coupling agent. The silane coupling agent preferably has a hydrolyzable reactive group such as a methoxy group, an ethoxy group, or an acetoxy group, which is bonded to be silicon, and a substituent having one or more reactive groups selected from an epoxy group, a vinyl group, an amino group, a halogen group, a mercapto group, and a (meth)acryloyl group as a substituent which is bonded to the same silicon. The silane coupling agent particularly preferably has a (meth)acryloyl group. Specific examples of the silane coupling agent include the silane coupling agent represented by Formula (1) described in WO2013/146069 and the silane coupling agent represented by Formula (1) described in WO2013/027786.

The ratio of the silane coupling agent in the solid content of the polymerizable composition (a residual after a volatile content is volatilized) is preferably 0.1% by mass to 30% by mass and more preferably 1% by mass to 20% by mass.

(Method of Forming Organic Layer)

The organic layer may be typically produced by applying the polymerizable composition to a support such as a base film or an inorganic layer to be layered. Examples of the method of application include a dip coating method, an air knife coating method, a curtain coating method, a roller coating method, a wire bar coating method, a gravure coating method, a slide coating method, or the extrusion coating method employing a hopper that is described in U.S. Pat. No. 2,681,294A (also called a die coating method), and among these methods, the extrusion coating method is preferably employed.

When the polymerizable composition for forming the organic layer is applied to the surface of the inorganic layer, the extrusion coating method is preferably used.

Then, the applied polymerizable composition may be dried. The drying method is not particularly limited.

The polymerizable composition may be cured by light (for example, ultraviolet rays), an electron beam, or heat rays and is preferably cured by light. Particularly, it is preferable to cure the polymerizable composition while heating the polymerizable composition at a temperature of 25° C. or higher (for example, 30° C. to 130° C.). The polymerizable composition is effectively cured by promoting the free motion of the polymerizable composition by heating and film formation can be conducted without causing damage to the base film.

The light to be emitted may be ultraviolet rays from a high pressure mercury lamp or a low pressure mercury lamp. The irradiation energy is preferably 0.1 J/cm$^2$ or more and more preferably 0.5 J/cm$^2$ or more. The polymerization of the polymerizable compound is inhibited by oxygen in the air and thus it is preferable to reduce the oxygen concentration or the oxygen partial pressure at the time of polymerization. In the case in which the oxygen concentration at the time of polymerization is reduced by a nitrogen substitution method, the oxygen concentration is preferably 2% or less and more preferably 0.5% or less. In the case in which the oxygen concentration at the time of polymerization is reduced by a pressure reduction method, the total pressure is preferably 1,000 Pa or less and more preferably 100 Pa or less. In addition, irradiation with energy of 0.5 J/cm$^2$ or more under reduced pressure conditions of 100 Pa or less to conduct ultraviolet polymerization is particularly preferable.

The polymerization rate of the polymerizable compound in the organic layer after the polymerizable composition is cured is preferably 20% by mass or more, more preferably 30% by mass or more, and particularly preferably 50% by mass or more. Herein, the polymerization rate means the proportion of reacted polymerizable groups among all polymerizable groups (for example, acryloyl groups and methacryloyl groups) in the monomer mixture. The polymerization rate can be quantified by the infrared absorption method.

The organic layer is preferably smooth with a high degree of film hardness. The smoothness of the organic layer is preferably a 1 μm square average roughness (Ra value) of less than 3 nm, and more preferably less than 1 nm.

The absence of protrusions and foreign matter such as particles on the surface of the organic layer is required. Thus, film formation of the organic layer is preferably conducted in a clean room. The degree of cleanliness is preferably class 10,000 or less and more preferably class 1,000 or less.

A high degree of hardness is preferable in the organic layer. When the degree of hardness of the organic layer is high, a smooth inorganic layer is formed. As a result, it is found that the barrier capability is improved. The degree of hardness of the organic layer can be denoted as a microhardness based on the nanoindentation method. The degree of microhardness of the organic layer is preferably 100 N/mm or higher, and more preferably 150 N/mm or higher.

The film thickness of the organic layer is not particularly limited. However, the film thickness is preferably 50 nm to 5,000 nm and more preferably 200 nm to 3,500 nm from the viewpoint of brittleness and light transmittance.

(Lamination of Organic Layer and Inorganic Layer)

Lamination of organic and inorganic layers can be conducted by successively and repeatedly forming an organic layer and an inorganic layer based on a desired layer configuration.

(Functional Layer)

The gas barrier film may have functional layers. Functional layers are described in detail in paragraphs "0036" to "0038" in JP2006-289627A. Examples of functional layers other than the above functional layers include matting agent layers, protective layers, solvent resistant layers, antistatic layers, smoothing layers, adhesion enhancing layers, light blocking layers, antireflective layers, hardcoat layers, stress relieving layers, antifogging layers, antifouling layers, and printing layers.

In the gas barrier film, an easily adhesive layer or an easily lubricating layer may be provided to be arranged between the base film and the organic layer (the organic layer in the barrier laminate disposed closest to the base film).

Examples of the easily adhesive layer include layers formed by using urethane, urethane acrylate, and acrylate as material. In addition, examples of the easily lubricating layer include layers formed by adding a filler and particles to the materials used for formation of the above easily adhesive layer.

<Adhesive Layer>

As an adhesive for forming the adhesive layer, an adhesive having a refractive index of an adhesive layer to be formed of 1.55 or more is preferable, an adhesive having a refractive index of an adhesive layer to be formed of 1.6 or more is more preferable, and an adhesive having a refractive index of an adhesive layer to be formed of 1.7 or more is even more preferable. The refractive index of the layer constituting the organic electroluminescent element is generally about 1.7 to 1.9, and this is because it is preferable that the difference between the refractive index of the layer constituting the organic electroluminescent element and the refractive index of the adhesive layer is small. By reducing the difference in refractive index between each layer constituting the organic electroluminescent device, without causing light from the light emitting layer and light that is emitted from the light emitting layer and reflected by a reflecting electrode or a reflecting layer to stay in the organic electroluminescent device, the light can reach the barrier protective layer. Since fine particles are included in the barrier protective layer, light effectively scatters and can be extracted.

As the adhesive, an ultraviolet curable adhesive (resin) is preferable and examples of the adhesive include ultraviolet curable epoxy resins, and ultraviolet curable acrylic resins. For example, XNR5516 (manufactured by Nagase Chemtex Corporation) can be mentioned.

In addition, as the adhesive layer, an adhesive sheet or tape may be used. As the adhesive sheet, a thin adhesive sheet is preferable. For example, an adhesive sheet that is widely known as an optical clear adhesive (OCA) can be mentioned.

<Reflecting Layer>

The organic electroluminescent device may include a reflecting layer. Due to the reflecting layer being included in the organic electroluminescent device, light from the organic electroluminescent element is effectively emitted in a desired direction. The reflecting layer is preferably arranged close to the substrate than to the organic electroluminescent element. For example, the reflecting layer may be provided between the organic electroluminescent element and the substrate. Specifically, it is preferable that the reflecting layer is arranged close to the substrate than to the light emitting layer, which will be described later. In addition, the reflecting layer may be provided on the outer side of the substrate with respect to the organic electroluminescent element. That is, the reflecting layer may be formed on the surface on the opposite side to the surface of the substrate on which the organic electroluminescent element is formed.

The reflectivity of the reflecting layer with respect to light at a wavelength of 380 nm to 780 nm is preferably 85% or more, more preferably 90% or more, and even more preferably 95% or more. The light, which is scattered on the fine particles in the barrier protective layer and is not extracted to the outside, out of light emitted from the organic electroluminescent element is reflected by the reflecting layer. Since the light is extracted into the air after this process is carried out repeatedly, as the reflectivity of the reflecting layer becomes higher, the external quantum efficiency is more improved.

Examples of the reflecting layer include a vapor deposition film of Al, Ag, or the like, and a plastic film with high reflectivity. Examples of the plastic film with high reflectivity include a plastic film of LUMIRROR (manufactured by Toray Industries, Inc.). The reflecting layer may also function as the reflecting electrode of the organic electroluminescent element.

<Organic Electroluminescent Element>

The organic electroluminescent element is configured to include electrodes each of which becomes a cathode and an anode and further include a light emitting layer between the two electrodes (hereinafter, also referred to "organic electroluminescent layer"). In the organic electroluminescent device, one electrode arranged close to the substrate may be a reflecting electrode which also functions as the reflecting layer. In addition, the other electrode arranged close to the adhesive layer is preferably a transparent electrode. The organic electroluminescent layer means a layer having at least a light emitting layer, and further having respective layers of a hole transport layer, an electron transport layer, a hole blocking layer, an electron blocking layer, a hole injection layer, and an electron injection layer, as functional layers other than the light emitting layer. The film thickness of each of the hole transport layer and the an electron transport layer is preferably 500 nm or less from the viewpoint of charge transporting properties and costs.

Regarding materials for producing the organic electroluminescent layer, and each functional layer and each electrode in the organic electroluminescent layer, configurations, lamination order, and the configuration of the organic electroluminescent device, the contents of paragraphs "0081" to "0122" of JP2012-155177A can be referred to.

In the case in which one electrode of the organic electroluminescent element is a reflecting electrode, a distance between the reflecting electrode and the light emitting layer is preferably 100 nm or more and more preferably 200 nm or more. For example, the film thickness of the hole transport layer is preferably 100 nm or more and more preferably 200 nm or more. When the distance between the reflecting electrode and the light emitting layer is 100 nm or more, mainly, the near field of excitons in the vertical direction of the layer causes plasmons to be excited on the metal surface. The energy turns into heat and the plasmon excitation is deactivated. Therefore, it is possible to suppress a tendency of a reduction in light emitting efficiency.

EXAMPLES

The present invention is described with greater specificity below through Examples. The materials, amounts used, ratios, processing contents, processing procedures, and the like that are indicated in the Examples below can be suitably modified without departing from the spirit of the present invention. Accordingly, the scope of the present invention is not limited by the specific examples given below.

[Production of Gas Barrier Film]

A layer of silicon nitride (50 nm) was formed on one surface of a polyethylene terephthalate (PET) film (base film, A4300, manufactured by Toyobo Co., Ltd. thickness: 100 μm) (a smoother surface of both surfaces of the PET film) by the plasma CVD method and thus an inorganic layer was formed. As raw material gases, a silane gas (flow rate of 160 sccm at 0° C. and a standard status of 1 atmospheric pressure, the same will be applied), an ammonia gas (flow rate of 370 sccm), a hydrogen gas (flow rate of 590 sccm), and a nitrogen gas (flow rate of 240 sccm) were used. A high-frequency power supply at a frequency of 13.56 MHz was used as a power supply. The polymerizable composition having the following composition was applied to the surface of the inorganic layer such that the film thickness when dried was 1,000 nm and thus a film was obtained. The obtained film was irradiated with ultraviolet rays (irradiation dose of 0.5 J/cm$^2$) under a nitrogen atmosphere having an oxygen content of 100 ppm or less and cured to produce an organic layer. A layer of silicon nitride was formed on the surface of the organic layer by the same plasma CVD method as described above to form an inorganic layer having a film thickness of 50 nm. Thus, a gas barrier film was obtained.

(Polymerizable Composition)

| | |
|---|---|
| Polymerizable compound (Acrylate 1) | 50 g |
| Polymerization initiator (ESACURE KTO46 manufactured by Lamberti S.p.A.) | 1 g |
| Silane coupling agent (KBM-5013 manufactured by Shin-Etsu Chemical Co., Ltd.) | 5 g |
| 2-Butanone | 400 g |

Acrylate 1

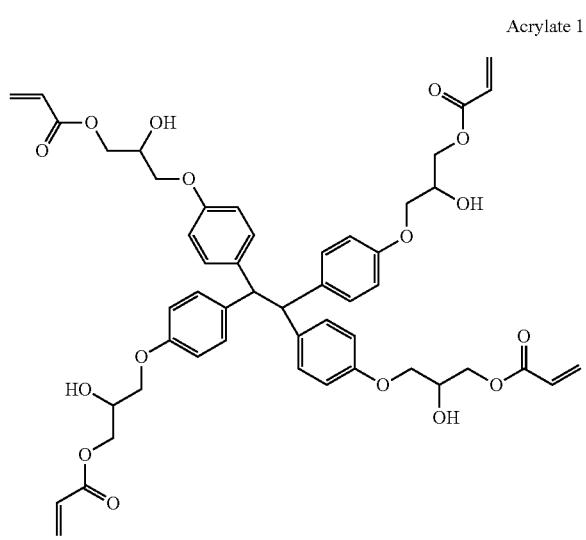 [SMILES: C=CC(=O)OCC(O)COc1ccc(C(c2ccc(OCC(O)COC(=O)C=C)cc2)C(c2ccc(OCC(O)COC(=O)C=C)cc2)c2ccc(OCC(O)COC(=O)C=C)cc2)cc1]

[Production of Barrier Protective Layer]

The surface of the above-produced gas barrier film produced arranged close to the base film was caused to adhere with glass, and the glass substrate was put into a washing container to perform an ultrasonic wave washing in a neutral detergent. Then, ultrasonic wave washing was performed in pure water, and the glass substrate was heated and dried at 120° C. for 120 minutes. Thereafter, the surface of the gas barrier film (inorganic layer) was treated with a silane coupling agent.

A film was formed by applying the following barrier protective layer forming material to the surface of the surface-treated gas barrier film using a die coater and the formed film was irradiated with ultraviolet rays with an irradiation dose of 0.5 J/cm² for 2 minutes and cured to form a barrier protective layer. Next, a film was formed by applying the following planarization layer forming material to the surface of the formed barrier protective layer using a die coater and the formed film was irradiated with ultraviolet rays with an irradiation dose of 0.5 J/cm² for 2 minutes and cured to form a planarization layer. Thus, a gas barrier film with the barrier protective layer was obtained.

(Barrier Protective Layer Forming Material)

Acrylate (polyfunctional acylate monomer, EA-200, manufactured by Osaka Gas Chemicals Co., Ltd.) 35% by volume Titanium oxide particles (refractive index n=2.7, average particle diameter: 15 nm) 15% by volume PMMA particles (MX-150 manufactured by Soken Chemical & Engineering Co., Ltd.) 50% by volume Polymerization initiator (IRGACURE 819 manufactured by BASF) 2% by mass with respect to acrylate (planarization layer forming material)

Acrylate (polyfunctional acylate monomer, EA-200, manufactured by Osaka Gas Chemicals Co., Ltd.) 70% by volume Titanium oxide particles (refractive index n=2.7, average particle diameter: 15 nm) 30% by volume Polymerization initiator (IRGACURE 819 manufactured by BASF) 2% by mass with respect to acrylate (planarization layer forming material)

[Production of Organic Electroluminescent Device]

Example 1

Using glass (thickness: 0.7 mm, EAGLE XG, manufactured by Corning Incorporated) as a substrate (hereinafter, also referred to as "glass substrate"), a layer of Al was formed on the surface of the glass substrate by vacuum deposition so as to have a film thickness of 60 nm, and thus a reflecting electrode (anode) also functioning as a reflecting layer was formed. A MoO₃ layer as a hole injection layer having a thickness of 2 nm was formed on the surface of the reflecting electrode by vacuum deposition. Further, a hole transport layer having a film thickness of 200 nm (α-NPD: a layer of Bis[N-(1-naphthyl)-N-phenyl]benzidine), a light emitting layer having a film thickness of 20 nm (a layer formed by using CBP (4,4'-Bis(carbazol-9-yl)biphenyl) as a host material and doped with 5% Ir(ppy)₃ (Tris(2-phenylpyridinato)iridium)), a hole blocking layer having a film thickness of 10 nm (a layer of BAlq(Bis-(2-methyl-8-quinolinolato)-4-(phenyl-phenolate)-aluminium (III))), and an electron transport layer having a film thickness of 20 nm (a layer of Alq₃(Tris(8-hydroxy-quinolinato)aluminum)) were respectively sequentially formed by vacuum deposition on the surface of the MoO₃ layer, and thus an organic electroluminescent layer was obtained.

Subsequently, LiF, Al, and Ag were sequentially deposited on the surface of the obtained organic electroluminescent layer with a film thickness of 0.5 nm, 1.5 nm, and 15 nm, respectively to form a transparent electrode (cathode). Thus, an organic electroluminescent element was obtained.

Figure 3A:
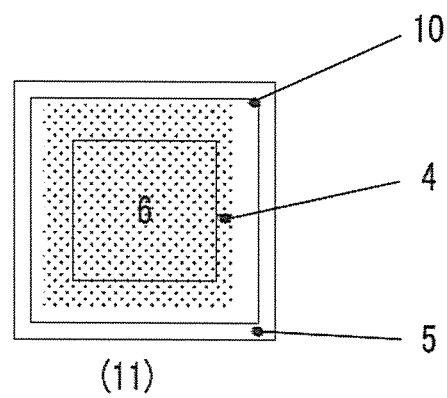
FIG. 3A is a view showing arrangements of an organic electroluminescent element and an adhesive layer in organic electroluminescent devices of Examples 1 to 3 and Comparative Example 1 when viewed from a direction normal to layers.

The surface of the obtained substrate with the organic electroluminescent element on which the organic electroluminescent element was provided was sealed using the gas barrier film with the barrier protective layer under a nitrogen atmosphere such that the surface of the gas barrier film close to the barrier protective layer was arranged toward the organic electroluminescent element and thus an organic electroluminescent device of Example 1 having a configuration shown in FIGS. 1A and 3A was obtained. Sealing was conducted such that the gas barrier film with an adhesive (XNR5516 manufactured by Nagase Chemtex Corporation) which was uniformly applied to the barrier protective layer surface of the gas barrier film with the barrier protective layer so as to cover the entire surface of the organic electroluminescent element with a sufficient area was used and caused to adhere with the substrate with the organic electroluminescent element and then the adhesive was irradiated with ultraviolet rays with an cumulative irradiation dose of 6.0 J/cm² to cure the adhesive.

Example 2

Using glass (thickness: 0.7 mm, EAGLE XG, manufactured by Corning Incorporated) as a substrate (hereinafter, also referred to as "glass substrate"), a layer of Ag was formed on the surface of the glass substrate by vacuum deposition to form a reflecting layer.

An electrode (anode) was formed by forming an ITO film on the surface on the opposite side to the surface of the glass substrate on which the reflecting layer was formed with a vacuum sputter. Further, a MoO₃ layer (a hole injection layer) having a film thickness of 2 nm, an α-NPD layer (hole transport layer) having a film thickness of 29 nm, a light emitting layer (a layer formed by using CBP as a host material and doped with 5% Ir(ppy)₃) having a film thickness of 20 nm, a BAlq layer (hole blocking layer) having a film thickness of 10 nm, and an Alq₃ layer (electron transport layer) having a film thickness of 20 nm were respectively sequentially formed by vacuum deposition on the surface of the ITO film and thus an organic electroluminescent layer was obtained.

Subsequently, LiF, Al, and Ag were sequentially deposited on the surface of the obtained organic electroluminescent layer with a film thickness of 0.5 nm, 1.5 nm, and 15 nm, respectively to form a transparent electrode (cathode). Thus, an organic electroluminescent element was obtained.

Figure 1B:
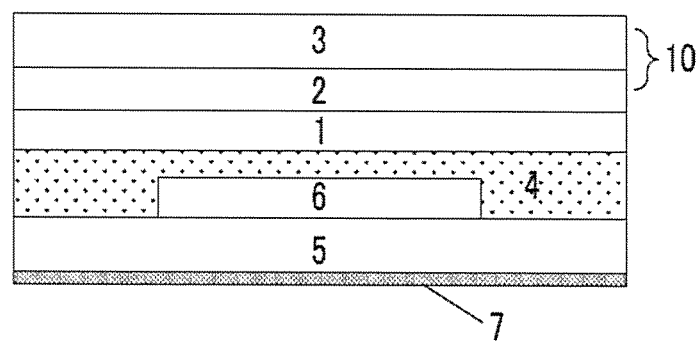

The obtained organic electroluminescent element was sealed using the gas barrier film with the barrier protective layer in the same manner as in Example 1 and thus an organic electroluminescent device of Example 2 having a configuration shown in FIGS. 1B and 3A was obtained.

Example 3

An organic electroluminescent element was formed on the surface of a gas barrier film close to the inorganic layer (silicon nitride surface) in the same procedure as in Example 1 except that the gas barrier film produced in the same manner as described above was used instead of using glass (EAGLE XG, manufactured by Corning Incorporated) and an organic electroluminescent device of Example 3 was produced.

Comparative Example 1

Figure 2A:
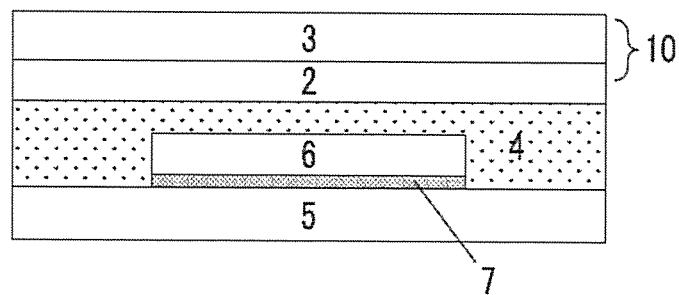
FIGS. 2A and 2B are schematic cross-sectional views of examples of an organic electroluminescent device not having a barrier protective layer.

An organic electroluminescent device of Comparative Example 1 having a configuration shown in FIGS. 2A and 3A was produced in the same procedure as in Example 1 except that the film thickness of the α-NPD layer on the glass substrate in Example 1 was set to 29 nm and, a gas barrier film (a gas barrier film not having a barrier protective layer) produced in the same manner as in the production of the gas barrier film described above was used instead of using the gas barrier film with the barrier protective layer used for sealing the organic electroluminescent layer.

Comparative Example 2

Figure 2B:
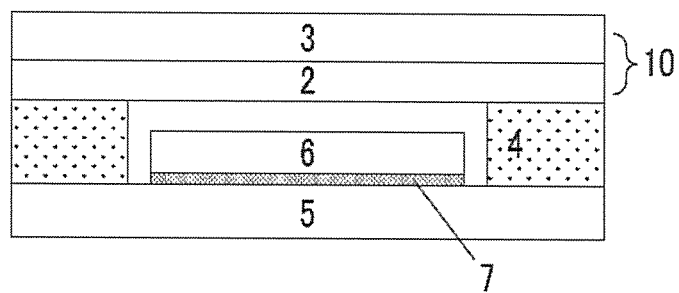
Figure 3B:
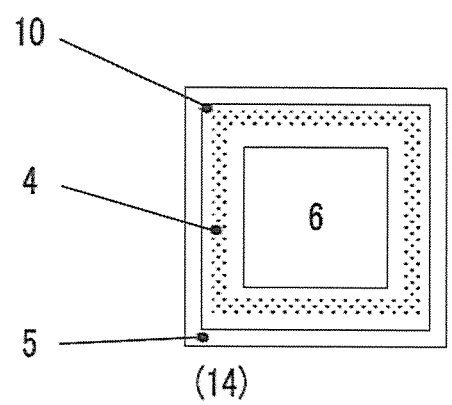
FIG. 3B is a view showing arrangements of an organic electroluminescent element and an adhesive layer in organic electroluminescent devices of Comparative Example 2 when viewed from a direction normal to layers.

An organic electroluminescent device of Comparative Example 2 having a configuration shown in FIGS. 2B and 3B was produced in the same procedure as in Example 1 except that the film thickness of the α-NPD layer on the glass substrate in Example 1 was set to 29 nm, a gas barrier film (a gas barrier film not having a barrier protective layer) produced in the same manner as in the production of the gas barrier film described above was used instead of using the gas barrier film with the barrier protective layer used for sealing the organic electroluminescent layer, and an adhesive was applied to the gas barrier film such that the gas barrier film was not in contact with the organic electroluminescent element to seal the organic electroluminescent.

[Evaluation of Organic Electroluminescent Device]

Each of the obtained organic electroluminescent elements was evaluated as follows.

(Barrier Properties)

Regarding barrier properties, the durability of the organic electroluminescent element was evaluated. A total area of regions in which dark spots are formed with respect to the initial light emitting area in the organic electroluminescent element that was left to stand for 100 hours under a high temperature high humidity environment (at 60° C., 90%) was used as an index for the durability of the organic electroluminescent element and evaluation was carried out based on the following criteria.

A: Less than 3%
B: 3% or more and less than 40%
C: 40% or more or no lighting (External Quantum Efficiency)

The external quantum efficiency was measured using a spectroradiometer SR-3AR manufactured by Topcon Technohouse Corporation.

(Adhesiveness)

The adhesiveness of the gas barrier films with the barrier protective layers of Examples and the glass barrier films of Comparative Examples was evaluated according to a cross-cut adhesion test (JIS K5400). The surface of the gas barrier film was cross-cut at intervals of 1 mm with a cutter knife at 90° with respect to the film surface from the opposite side to the base film 3 of the gas barrier film, thereby producing 100 cross-cuts of 1 mm square. A MYLAR tape (manufactured by Nitto Denko Corporation) was attached to the cross-cut surface and peeled using a tape peel testing machine. The number of cells remaining without being peeled off among the 100 cross-cuts on the barrier protective layer 1 and the base film 2 was counted and evaluated based on the following criteria.

A: The number of cells remaining was 95 or more.
B: The number of cells remaining was 80 to 94.
C: The number of cells remaining was 50 to 79.
D: The number of cells remaining was 49 or less.

The results are shown in Table 1.

TABLE 1

| | Example 1 | Example 2 | Example 3 | Comparative Example 1 | Comparative Example 2 |
|---|---|---|---|---|---|
| Barrier performance | A | A | A | B | B |
| External quantum efficiency | 6.21% | 6.15% | 6.24% | 2.91% | 3.08% |
| Density | A | A | A | C | C |

EXPLANATION OF REFERENCES

1: barrier protective layer
2: barrier layer
3: base film
4: adhesive layer
5: substrate
6: organic electroluminescent element
7: reflecting layer
10: gas barrier film

What is claimed is:
1. An organic electroluminescent device comprising, in this order:
a substrate;
an organic electroluminescent element; and
a gas barrier film,
wherein the organic electroluminescent element is sealed by bonding the substrate and the gas barrier film with an adhesive layer, and includes two electrodes and a light emitting layer that is arranged between the two electrodes,
the gas barrier film includes a base film and a barrier layer that includes at least one inorganic layer, and the barrier layer is arranged closer to the organic electroluminescent element than to the base film,
the organic electroluminescent device further comprises a barrier protective layer that is arranged between the adhesive layer and the barrier layer, and a planarization layer that is arranged between the barrier protective layer and the adhesive layer, the barrier protective layer is a layer formed of a barrier protective layer forming material that includes organic particles and a binder, and the binder contains inorganic fine particles and a polyfunctional acrylic monomer.

2. The organic electroluminescent device according to claim 1, further comprising:

a reflecting layer that is arranged closer to the substrate than to the light emitting layer.

3. The organic electroluminescent device according to claim 2, wherein the reflecting layer is arranged between the substrate and the light emitting layer, and the reflecting layer is one of the two electrodes.

4. The organic electroluminescent device according to claim 3, wherein a distance between the reflecting layer and the light emitting layer is 100 nm or more.

5. The organic electroluminescent device according to claim 3, wherein the barrier layer is composed of a barrier laminate that includes an inorganic layer and an organic layer.

6. The organic electroluminescent device according to claim 2, wherein the reflecting layer is arranged on the outer side of the substrate with respect to the organic electroluminescent element.

7. The organic electroluminescent device according to claim 6, wherein the barrier layer is composed of a barrier laminate that includes an inorganic layer and an organic layer.

8. The organic electroluminescent device according to claim 1, wherein the inorganic fine particles are titanium oxide fine particles.

9. The organic electroluminescent device according to claim 1, wherein the adhesive layer is formed of an ultraviolet curable adhesive.

10. The organic electroluminescent device according to claim 1, wherein a refractive index of the adhesive layer is 1.55 or more.

11. The organic electroluminescent device according to claim 1, wherein the adhesive layer is arranged between the organic electroluminescent element and the barrier protective layer.

12. The organic electroluminescent device according to claim 11, wherein the adhesive layer is formed over an entire surface of the organic electroluminescent element on the opposite side to the barrier protective layer.

13. The organic electroluminescent device according to claim 1, wherein the barrier layer is composed of a barrier laminate that includes an inorganic layer and an organic layer.

14. The organic electroluminescent device according to claim 1, wherein the barrier protective layer forming material includes cross-linked resin particles, inorganic fine particles, and a polyfunctional acrylic monomer, and the content of the cross-linked resin particles in the barrier protective layer is 30% by volume or more to 66% by volume or less.

15. The organic electroluminescent device according to claim 1, wherein the organic particles are cross-linked polymethyl methacrylate particles.

* * * * *